United States Patent [19]

Inami et al.

[11] 4,374,332

[45] Feb. 15, 1983

[54] CASCADE TYPE CMOS SEMICONDUCTOR DEVICE

[75] Inventors: Nobuo Inami; Kojiro Tanaka, both of Tokyo, Japan

[73] Assignee: Kabushiki Kaisha Daini Seikosha, Japan

[21] Appl. No.: 187,747

[22] Filed: Sep. 16, 1980

[30] Foreign Application Priority Data

Sep. 18, 1979 [JP] Japan .................................. 54-11979

[51] Int. Cl.³ ..................... H03K 3/354; H01L 27/04; G04C 10/00
[52] U.S. Cl. .................................... 307/304; 307/269; 307/270; 307/296 A; 357/42; 368/219
[58] Field of Search ................................. 307/448–453, 307/464, 468, 469, 480, 304, 296 R, 296 A, 269, 475, 270; 365/226, 227; 368/204, 219; 357/42

[56] References Cited

U.S. PATENT DOCUMENTS

| | | | |
|---|---|---|---|
| 3,828,547 | 8/1974 | Fujita | 307/451 X |
| 4,013,901 | 3/1977 | Williams | 307/303 X |
| 4,024,418 | 5/1977 | Hankel | 357/42 X |
| 4,094,137 | 6/1978 | Morokawa | 368/202 X |
| 4,229,668 | 10/1980 | Ebihara et al. | 368/204 X |

Primary Examiner—Larry N. Anagnos
Assistant Examiner—David R. Hudspeth
Attorney, Agent, or Firm—Robert E. Burns; Emmanuel J. Lobato; Bruce L. Adams

[57] ABSTRACT

Within a semiconductor device having two sets of CMOS inverters, the two sets of CMOS inverters are electrically connected in series to a power source for supplying electric power to the semiconductor device. The two sets of CMOS inverters are formed in an oscillating circuit for producing a time base signal and a frequency dividing circuit, respectively. Device operating current and power consumption are accordingly reduced.

6 Claims, 6 Drawing Figures

CASCADE TYPE CMOS SEMICONDUCTOR DEVICE

BACKGROUND OF THE INVENTION

The present invention relates to an improved semiconductor device which can be operated with less power than conventional semiconductor devices.

In the prior art, various semiconductor devices have been invented and the characteristics of semiconductor devices have been remarkably improved during the past ten years. An electronic wrist watch has been realized due to such a semiconductor device, and it is possible to operate such a watch for two or three years by the use of a little button type battery. However, social conditions require that energy consumption should be reduced to as little as possible to further increase battery life, and a semiconductor device having an operating current which is extremely small is intensely required. A complementary type insulated gate transistor semiconductor device (referred to as a CMOS-IC hereinafter) is known to have the lowest IC operating current. If the device operating frequency is given as f, the current I of the CMOS-IC will be described by the following equation:

$$I = CVf \tag{1}$$

where, V is an applied voltage to the IC, and C is a capacitance of transistors used in the IC.

Therefore, the reduction of the current can be realized by selecting a small value of capacitance C, a low applied voltage V or a low operating frequency f. However, in the case of an electronic timepiece, the frequency of an oscillating circuit used as a time is almost completely determined by a resonance frequency of a quartz vibrator of the timepiece, which is selected in accordance with a required accuracy or a size of the timepiece. Recently, the frequency is almost always selected at 32 KHz. There is the possibility of the selection of a higher oscillating frequency, such as on the order of 4 MH$_3$ by which greater timepiece accuracy can be realized, but it it not expected that a lower frequency will be selected.

On the other hand, the applied voltage V is determined in accordance with the type of battery that is used. Therefore, for the reduction of the current, there is no way other than the reduction of the capacitance C, and in order to decrease the capacitance C, the attempt of each semiconductor device manufacturer has been to increase the physical working accuracy of the device fabrication to make the size of the device transistors. Roughly speaking, it is said that the capacitance will be decreased to a quarter if the transistor dimensions decrease by a half. However, the present working size for an IC, in the case of the pattern for aluminum wiring, is 5 $\mu$m, so that in order to realize a 2.5 $\mu$m working size, semiconductor manufacturing equipment widely in use should be replaced with new equipment. Consequently, it follows that a great increase in cost of semiconductor devices would result.

FIG. 1 is a block diagram of the conventional IC for a timepiece. Circuit 2 is a quartz oscillating circuit of, for example, 32 KHz for a time base, 3 is a buffer circuit for shaping the output waveform from the oscillating circuit 2 and applying the shaped signal to a subsequent frequency dividing circuit 4. The frequency dividing circuit 4 receives a time signal from the buffer circuit 3 and divides the received signal so as to obtain a signal having a predetermined frequency such as 32 KHz. Element 5 is a driving circuit for a display device 6 in which the output from the frequency circuit 4 is changed into a time signal, and display device 6 is, for example, a liquid crystal display device for displaying a time in accordance with the signal from the driving circuit 5. To operate the conventional circuit, an AgO$_2$ button type 1.5 volt battery 1 is usually used as a power source. The total amount of current I consumed in the circuit is the summation of the current $I_o$ in the oscillating circuit 2, the current $I_B$ in the buffer circuit 3, the current $I_D$ in the frequency dividing circuit 4 and the current $I_S$ in the driving circuit 5.

$$I_T = I_O + I_B + I_D + I_S \tag{2}$$

For example, in a typical digital quartz wrist watch, each current value is as follows: $I_O = 0.5$ $\mu$A, $I_B = 0.3$ $\mu$A, $I_D = 0.2$ $\mu$A, and $I_S = 0.5$ $\mu$A. Therefore, the total current $I_T$ will be as follows:

$$I_T = 1.5 \mu A$$

A voltage step-up circuit for the display device 6 is omitted from FIG. 1. Furthermore, the current $I_s$ for the driving circuit 5 contains the current for the display device 6. In FIG. 2, some portions such as the oscillating circuit 2, the buffer circuit 3, etc. in FIG. 1, are illustrated in more detail. T$_1$, T$_2$, T$_3$, T$_4$, T$_5$ and T$_6$ are MOS transistors, 7 and 9 are capacitors for oscillation and 8 is a quartz vibrator.

SUMMARY OF THE INVENTION

It is an object of the present invention to provide a semiconductor device having a simple structure in which a cascade type CMOS-IC is used in order to realize a lower current semiconductor device which can be fabricated by a conventional manufacturing technique.

DESCRIPTION OF THE PREFERRED EMBODIMENTS

Figure 1:
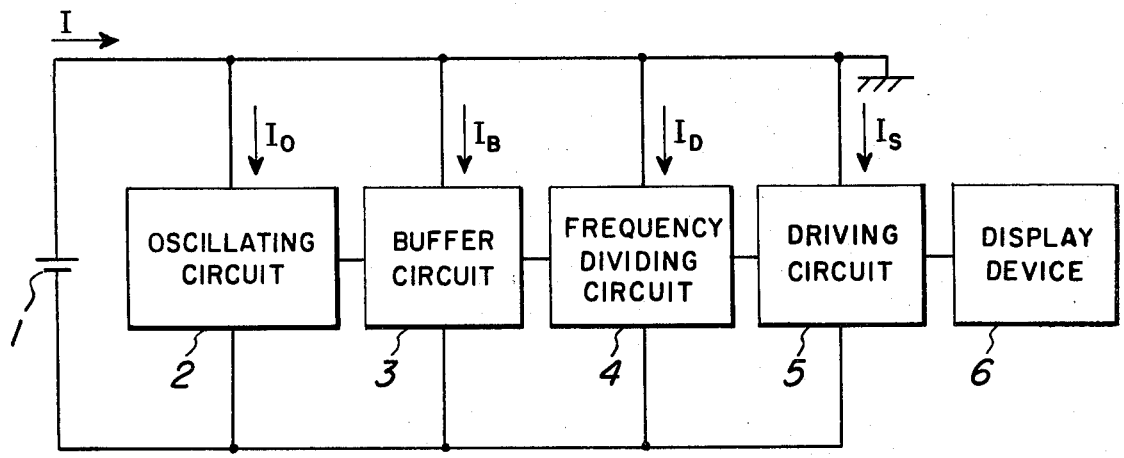
FIGS. 1 and 2 illustrate circuit structures of the conventional CMOS semiconductors, respectively.

As shown by equation (1), the current I of the CMOS IC is represented by CVf. Now, a method for decreasing the current without changing the device fabrication technique will be described. The current will be decreased to a half if the applied voltage is decreased to a half. On the other hand, if circuit values are selected in such a way that the current $I_O$ of the oscillating circuit 2 is equal to the sum of the current $I_B$ of the buffer circuit 3 and the current $I_D$ of the frequency dividing circuit 4 and the circuit connecting the buffer circuit 3 to the frequency dividing circuit 4 in parallel is connected to the oscillating circuit in series, when the battery 1 is connected thereto, the total current $I_N$ of the circuit will be decreased as shown by the following equation:

$$I_N = I_O + I_S = I_B + I_D + I_S \qquad (3)$$

Then, in order that the oscillating circuit 2, the buffer circuit 3 and the frequency dividing circuit 4 can be operated by a half of the 1.5 V battery voltage, it is furthermore required that the threshold voltage $V_{TH}$ of each transistor should be controlled by means of an ion implanatation fabrication technique or the like. At first, currents $I_B$ and $I_D$ of each circuit become unnecessary. When the circuit connecting the buffer circuit 3 to the frequency dividing circuit 4 in parallel is connected to the oscillating circuit 2 in series, the total current $I_N = 0.75\ \mu A$ will be obtained from the following condition:

$$I_O = 0.25\ \mu A$$

$$I_S = 0.5\ \mu A$$

Figure 2:
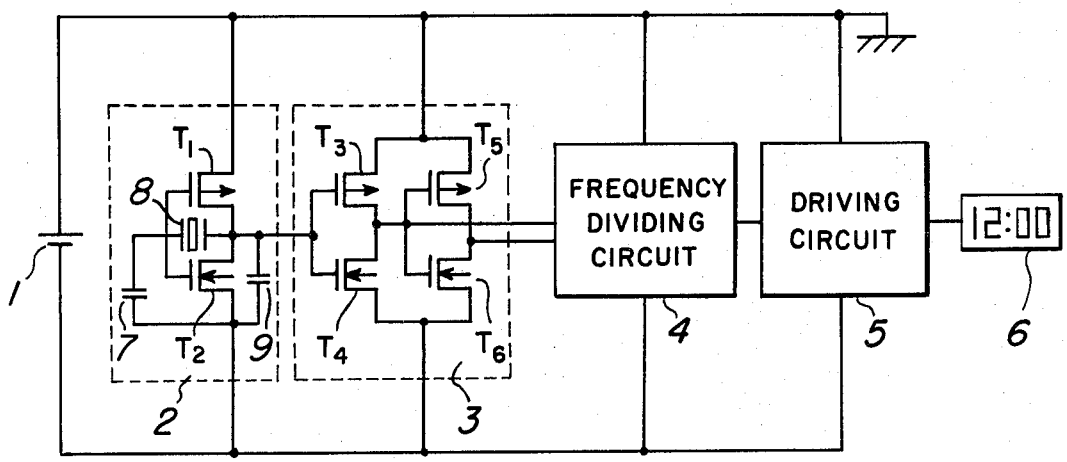
Figure 3:
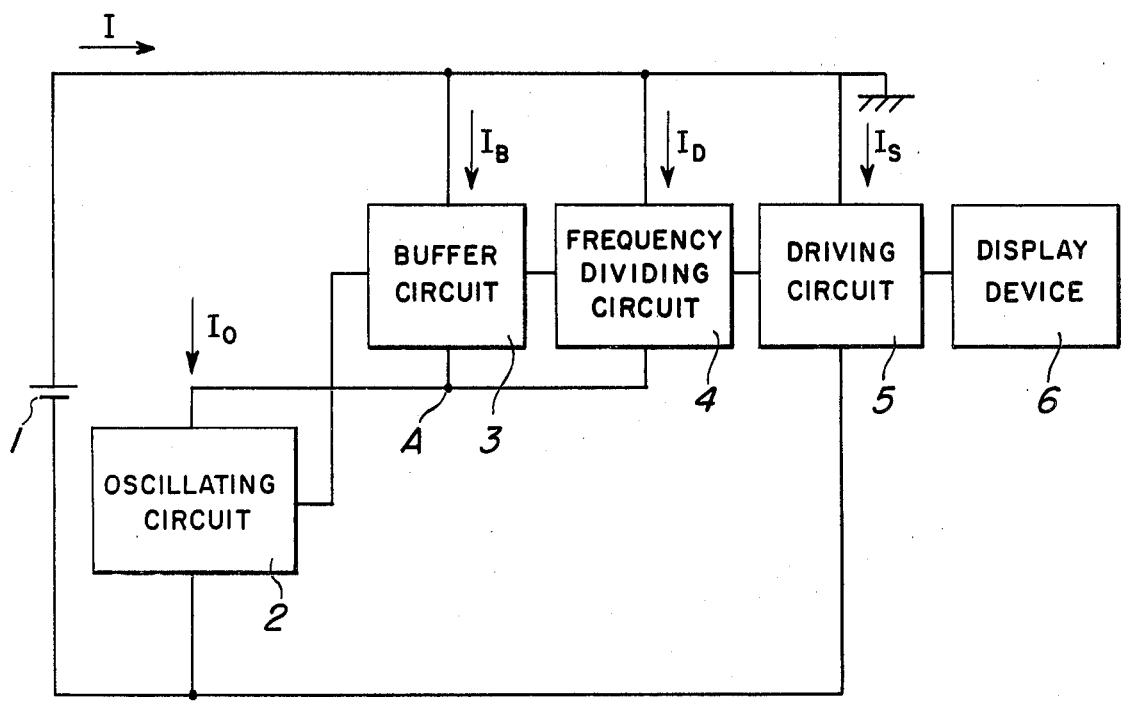
FIGS. 3 and 4 illustrate circuit structures of embodiments of cascade type CMOS semiconductors in accordance with the present invention, respectively.
Figure 4:
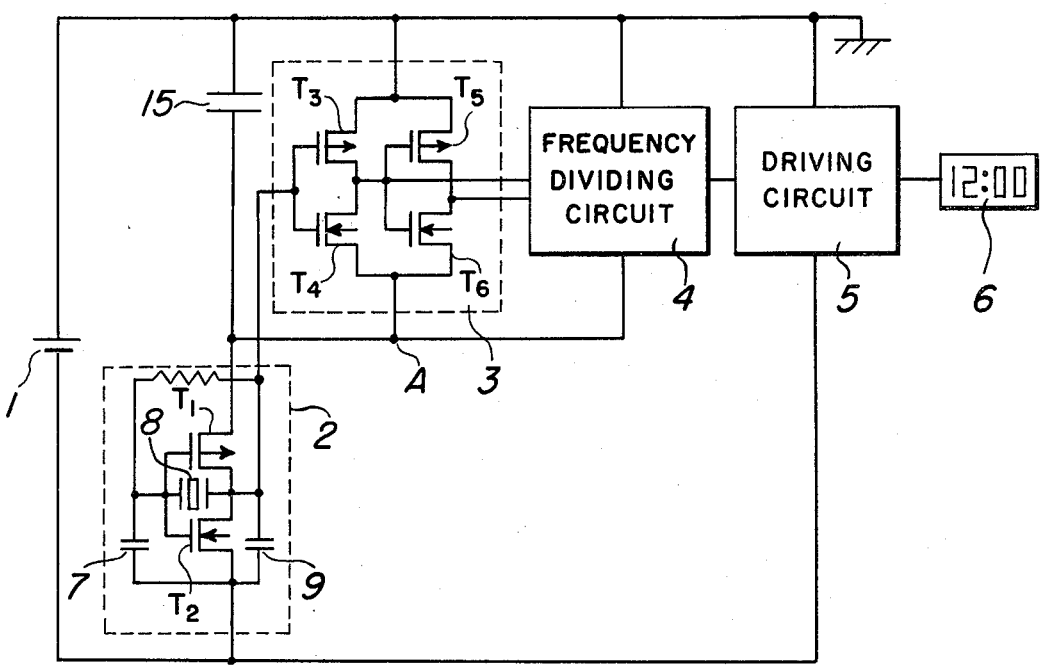

Therefore, according to the present invention, the circuit consuming a current of 1.5 μA can be changed into a circuit consuming a current of 0.75 μA while allowing the use of the same manufacturing equipment as a conventional circuit. FIG. 3 illustrates an embodiment of the present invention and the same reference numbers as that used in FIGS. 1 and 2 are commonly used therein. FIG. 4 illustrates a detailed circuit diagram thereof. In addition, as described above, the potential $V_A$ at the point A in FIGS. 3 and 4 may be set at half of a battery voltage $V_{DD} = 1.5$ V, if each circuit value is suitably selected. However, it should be noted that, for absorbing the change of voltage applied to each circuit with time, a suitable capacitor 15 should be arranged between the point A and ground.

The novel semiconductor device having such a structure as that of the embodiment in FIG. 3, will be hereinafter referred to as a cascade type CMOS semiconductor device. The present invention is not limited to a two-stage type, but the present invention involves a three stage, a four-stage type or more than four-stage type. In order to make the present invention, as described above, it is necessary to control the threshold level of transistors so as to be low, and moreover, to select the element values in the oscillating circuit 2, the buffer circuit 3 and the frequency dividing circuit 4 so as to satisfy the following equation:

$$I_O = I_B + I_D$$

Figure 5:
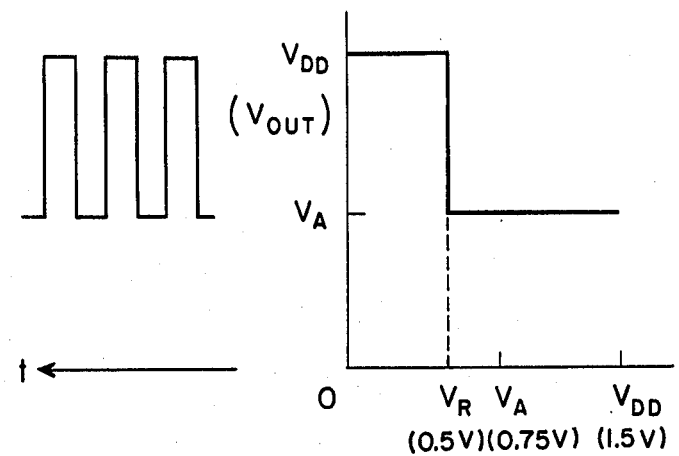
FIG. 5 illustrates an input-output characteristic curve of a first stage inverter of a buffer circuit; and, FIG. 6 illustrates a sectional view of an embodiment of a semiconductor device according to the present invention.
Figure 5:
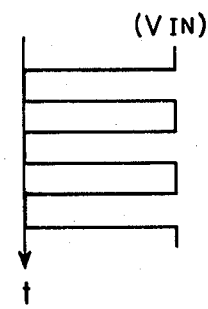

However, it is impossible to perfectly make the present invention even if the above mentioned condition is satisfied. This is the reason why some special means is required for transmitting the signal between circuits respectively connected to the different voltages. In this embodiment of the present invention, the signal transmission is carried out between the oscillating circuit 2 and the buffer circuit 3. As shown in the following table, in the two-stage structure, it is realized by setting the threshold value of each transistor at a quarter of the battery voltage. It will be proved that no current is consumed for the signal transmission between the circuits respectively supplied the different voltages in this embodiment. FIG. 5 illustrates an input-output characteristic of an inverter forming the buffer circuit 3. The inverter is realized by the use of transistors $T_3$ and $T_4$, as well as the conventional form of the buffer circuit.

However, the threshold values thereof are different from the conventional one as shown in the following table.

|       | CONVENTIONAL CIRCUIT | CIRCUIT OF THE PRESENT INVENTION |
|-------|----------------------|----------------------------------|
| $T_1$ | $-0.7$ V             | $-0.3$ V                         |
| $T_2$ | $0.7$ V              | $+0.3$ V                         |
| $T_3$ | $-0.7$ V             | $-1.1$ V                         |
| $T_4$ | $0.7$ V              | $-0.5$ V                         |
| $T_5$ | $-0.7$ V             | $-0.3$ V                         |
| $T_6$ | $0.7$ V              | $+0.3$ V                         |

If the values of conductivity coefficients K of transistors $T_3$ and $T_4$ are carefully determined, input-output characteristics shown in FIG. 5 in which a voltage $V_R$ inverted by an inverter is approximately a center voltage between the voltage at both ends of the lower stage circuit can be realized. In this embodiment, the voltage $V_R$ inverted by inverter is 0.5 V.

Figure 6:
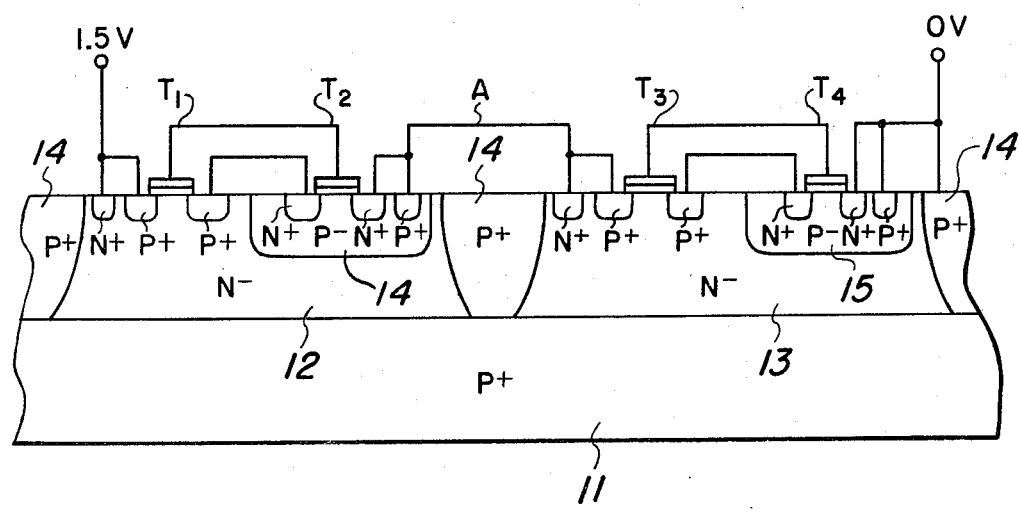

Furthermore, FIG. 6 illustrates the actual structure of such a cascade type CMOS semiconductor device. For example, N⁻ layers 12 and 13 are formed on P+ substrate 11 by the use of an epitaxial technique. Although the semiconductor device is fabricated by forming CMOS transistors in the N⁻ layers 12 and 13, electrical isolation between the N⁻ layers 12 and 13 is necessary for realizing a cascade type CMOS semiconductor device. In FIG. 6, the isolation is carried out by the use of P+, diffusion layer 14, however, the isolation is also carried out by various isolating methods, for example, an air isolating method such as SOS, a SiO₂ isolating method such as LOCOS, or the like.

As described above, according to the embodiment of the present invention, it is clear that decreasing the current in the electronic timepiece circuit from 1.5 μA to 0.75 μA is possible without changing any manufacturing equipment or fabricating technique or increasing the working accuracy. The object of the present invention is not limited to only a semiconductor device for an electronic timepiece, and the present invention is also effectively applicable to various other electronic devices.

What is claimed is:

1. A CMOS semiconductor device, comprising:
    a first CMOS circuit having input, output and power terminals and comprising a CMOS transistor pair having the source of one transistor and the drain of the other transistor connected together at a node to define said output terminal and for connecting the respective transistor channels in series, having the respective gates of said transistors connected together to define said input terminal, and wherein the drain of said one transistor and the source of said other transistor define said power terminals;
    a second CMOS circuit having input, output and power terminals and comprising a CMOS transistor pair having the source of one transistor and the drain of the other transistor connected together at a node to define said output terminal and for connecting the respective transistor channels in series, having the respective gates of said transistors connected together to define said input terminal, and wherein the drain of said one transistor and the source of said other transistor define said power terminals;

respective power terminals of said first and second CMOS circuits being connected together so that the channels of their respective CMOS transistor pairs are connected in series;

a signal lead free of reactive circuit elements and connecting said output terminal of said CMOS transistor pair of said first CMOS circuit to said input terminal of said CMOS transistor pair of said second CMOS circuit; and wherein said transistors comprising said CMOS transistor pairs have respective threshold voltage values effective to allow signal transmission from said output terminal to said input terminal substantially without current flow between said first and second CMOS circuits.

2. A CMOS semiconductor device according to claim 1: wherein said first CMOS circuit is an oscillator circuit for generating an oscillating time base signal; and wherein said second CMOS circuit is comprised of a frequency divider circuit and a buffer circuit having an input terminal connected to said signal lead for receiving and shaping the oscillating time base signal from said oscillator circuit and for applying the shaped signal to said frequency divider circuit.

3. A CMOS semiconductor device according to claim 1 or 2, further comprising: a power source, and wherein said first and second CMOS circuits are connected in series with said power source.

4. A CMOS semiconductor device according to claim 1 or 2, wherein: said first and second CMOS circuits together comprise an integrated circuit; and wherein said integrated circuit comprises means for electrically isolating said first CMOS circuit from said second CMOS circuit.

5. A CMOS semiconductor device according to claim 1 or 2: wherein said first CMOS circuit is comprised of first and second CMOS transistors having their respective channels connected in series; wherein said second CMOS circuit is comprised of third and fourth CMOS transistors having their respective channels connected in series, fifth and sixth CMOS transistors having their respective channels connected in series, and the pair of third and fourth transistors are connected with the series connection of their respective channels in parallel with the series connection of the respective channels of said fifth and sixth CMOS transistors; wherein said first transistor is connected to said fourth and sixth transistors; and wherein said transistors have the following respective approximate threshold voltages;

first transistor: −0.3 V,
second transistor: +0.3 V,
third transistor: −1.1 V,
fourth transistor: −0.5 V,
fifth transistor: −0.3 V,
sixth transistor: +0.3 V.

6. A CMOS semiconductor device according to claim 5, further comprising a 1.5 volt power source.

* * * * *